(12) United States Patent
Kim et al.

(10) Patent No.: US 10,496,932 B2
(45) Date of Patent: Dec. 3, 2019

(54) COMPACT RF DRIVER FOR PAUL TRAPS USED IN QUANTUM COMPUTERS AND METHODS OF MAKING AND USING SAME

(71) Applicant: Duke University, Durham, NC (US)

(72) Inventors: Jungsang Kim, Chapel Hill, NC (US); Geert Vrijsen, Durham, NC (US); Robert Spivey, Durham, NC (US)

(73) Assignee: Duke University, Durham, NC (US)

( * ) Notice: Subject to any disclaimer, the term of this patent is extended or adjusted under 35 U.S.C. 154(b) by 0 days.

(21) Appl. No.: 16/039,186

(22) Filed: Jul. 18, 2018

(65) Prior Publication Data

US 2019/0057318 A1 Feb. 21, 2019

Related U.S. Application Data

(60) Provisional application No. 62/533,918, filed on Jul. 18, 2017.

(51) Int. Cl.
| | |
|---|---|
| *G06N 10/00* | (2019.01) |
| *H03H 7/38* | (2006.01) |
| *H01J 49/42* | (2006.01) |
| *H03K 3/38* | (2006.01) |

(52) U.S. Cl.
CPC ............... *G06N 10/00* (2019.01); *H03H 7/38* (2013.01); *H01J 49/4225* (2013.01); *H03K 3/38* (2013.01)

(58) Field of Classification Search
CPC .. G06N 10/00; H03H 7/38; H03K 3/38; H01J 49/422; H01J 49/4225; H01J 49/423; H01J 49/4235
See application file for complete search history.

(56) References Cited

U.S. PATENT DOCUMENTS

| | | | | |
|---|---|---|---|---|
| 2010/0182039 A1* | 7/2010 | Baumgardner | ........ | G06N 10/00 326/7 |
| 2011/0290995 A1* | 12/2011 | Kumph | ............... | H01J 49/0018 250/282 |
| 2016/0300155 A1* | 10/2016 | Betz | ..................... | H01L 39/025 |

OTHER PUBLICATIONS

De Motte et al, "Experimental System Design for the Integration of Trapped-Ion and Superconducting Qubit Sysstems", https://arxiv.org/abs/1510.07298, 2016 (Year: 2016).*
Brandl et al, "Cryogenic Resonator Design for Trapped Experiments in Ion Paul Traps", Appl. Phys. B (2016) 122:157 (Year: 2016).*
De Motte, et al, "Experimental Systems Design for the integration of Trapped-Ion and Superconducting Qubit Systems", https://arxiv.org/abs/1510.07298, 2016 (Year: 2016).*
M. F. Grandl et al., "Cryogenic resonator design for trapped ion experiments in Paul traps", "Applied Physics B", Publisher: Springer, DOI 10.1007/s00340-016-6430-z, May 18, 2016, 122:157.

* cited by examiner

*Primary Examiner* — David E Smith
(74) *Attorney, Agent, or Firm* — Kaplan Breyer Sch'Warz, LLP

(57) ABSTRACT

Aspects of the present disclosure describe a compact RF driver circuit for Paul traps in trapped ion quantum computers and methods, and structures including same.

14 Claims, 3 Drawing Sheets

COMPACT RF DRIVER FOR PAUL TRAPS USED IN QUANTUM COMPUTERS AND METHODS OF MAKING AND USING SAME

CROSS REFERENCE TO RELATED APPLICATIONS

This application claims the benefit of U.S. Provisional Patent Application Ser. No. 62/533,918 filed 18 Jul. 2017 which is incorporated by reference as if set forth at length herein.

UNITED STATES GOVERNMENT INTEREST

This invention was made with United States Government support under Federal Grant No. W911NF-10-1-0231 awarded by the Army Research Office. The United States Government has certain rights to this invention.

TECHNICAL FIELD

This disclosure relates generally to quadrupole ion traps that employ dynamic electric fields to trap charged particles, i.e., radio frequency (RF) or Paul traps. More specifically, it pertains to a compact RF driver for a Paul trap used in trapped ion quantum computing and method of making and/or using same.

BACKGROUND

As is known, a Paul trap is a type of quadrupole ion trap that uses static direct current (DC) and RF oscillating electric fields to trap ions. As such, it is an important component of a trapped ion quantum computer that uses atomic ions as the basic building blocks. To effectively trap ions, a sufficiently high RF voltage (50-300V) must be applied to the Paul trap.

One way known in the art to drive an RF Paul trap for atomic ions employs a helical resonator to boost RF voltage at a target frequency (5-1000 MHz). Unfortunately, such helical resonators are generally bulky, mechanically unstable, and exhibit undesirable drift(s). Furthermore—given their bulk—contemporary helical resonators are largely incompatible with cryogenic ion trap configurations and as such must include undesirable cabling to the trap resulting in resistive loss(es).

Alternative methods including tank circuits have been explored in the art. Such methods and circuits however, have only exhibited very limited frequencies (i.e., 5-10 MHz) and as such have not proven useful for light ions employed applications including quantum computing.

SUMMARY

The above problems are solved, and an advance is made in the art according to aspects of the present disclosure directed to an improved, compact RF driving circuit for quadrupole ion traps (Paul traps) that are essential components to important contemporary systems including trapped ion quantum computers.

In contrast to the prior art—compact RF driving circuits according to aspects of the present disclosure advantageously do not employ bulky, mechanically unstable helical resonator(s). In further contrast to the prior art that employed such helical resonators, compact RF driving circuits according to aspects of the present disclosure are advantageously compatible with necessary cryogenic techniques and structures employed in trapped ion configurations such as those employed in contemporary applications including quantum computing.

In sharp contrast with prior art tank circuit implementations that employ impedance matched amplifiers (i.e., 50 Ω)—compact RF driving circuits according to aspects of the present disclosure employ very low-output-impedance amplifiers and are not impedance matched and advantageously do not exhibit impedance matching problems at higher frequencies that plague the prior art.

Additionally, of further advantage, compact RF driving circuits according to the present disclosure may employ superconducting materials compatible with necessary cryogenic temperatures and vacuum techniques while providing high current operation at sufficiently high frequencies, less thermal noise, and less intrinsic heating that undesirably heats ion sample(s).

Finally, of still further advantage, compact RF driving circuits according to the present disclosure do not require tuning circuits that are employed in the prior art to provide impedance and load capacitance matching.

BRIEF DESCRIPTION OF THE DRAWING

A more complete understanding of the present disclosure may be realized by reference to the accompanying drawing in which.

Figure 1:
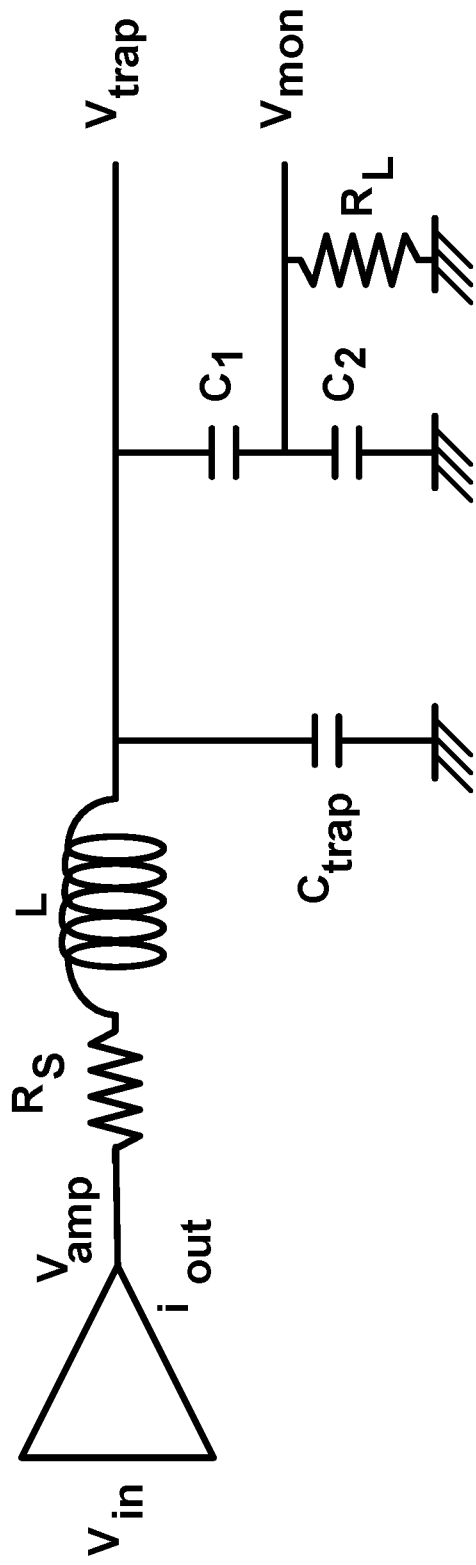
FIG. 1 is a schematic diagram showing an illustrative, compact RF driver circuit according to aspects of the present disclosure.

The illustrative embodiments are described more fully by the Figures and detailed description. Embodiments according to this disclosure may, however, be embodied in various forms and are not limited to specific or illustrative embodiments described in the drawing and detailed description.

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGs comprising the drawing are not drawn to scale.

By way of some additional background, those skilled in the art will readily appreciate that quantum computing is an emerging technology that leverages a quantum mechanical phenomenon no available in classical systems, e.g., superposition and entanglement, etc., to process information. In a conventional computing system, the basic unit of information is a bit, which is a two-state element that can be either in a "one" or a "zero" state. In contrast, the basic unit of information in a quantum-computing system is referred to as a qubit, can be in any superposition of both states at the same time (referred to as "superposition states"). Furthermore, many qubits can be in a superposition of correlated states in a way that the system cannot be described as a product of the individual qubit states (referred to as "entangled states"). These forms of qubit states representing the information are not available in conventional (classical) computers. As a result, theoretically, a large-scale quantum computer can solve some problems that are not practically feasible using conventional computing approaches. Unfortunately, quantum computers have proven difficult to realize in large scale due—in part—to many known implementation difficulties.

One approach to quantum computing employs "trapped-ion processing", in which atomic ions are trapped in a free-space position via a quadrupole ion trap (Paul trap). The position of the trap location is determined by the RF field null in the electric field generated by RF signals applied to a plurality of RF driver electrodes that define the ion trap. Once trapped, the ions are addressed and read optically using one or more optical signals. As will be appreciated by those skilled in the art, such traps are desirably operated under cryogenic conditions, and how there are driven is of critical importance to their operational effectiveness.

With this background in place, we begin by again noting that one typical method to generate a sufficiently high RF voltage (50-300V) necessary to drive an RF Paul trap for atomic ions is to employ a helical resonator to boost the RF voltage at a target frequency (5-1000 MHz). As noted, such method(s) require a helical resonator that is bulky, mechanically unstable and largely incompatible with necessary extreme low temperature (cryogenic) operation of the trap as such resonators are too bulky to fit within the mechanical confines of a cryostat. Accordingly, electrical cabling interconnecting the resonator to the trap is necessary leading to an undesirable loss.

Other prior art methods—such as those employing RF tank circuits—required an amplifier impedance matching that leads to difficulty achieving the high frequencies required while generating sufficiently large voltages (over 100V RF amplitude) to trap heavy atomic ions at higher frequencies (i.e. 30-50 MHz; >40 MHz).

Additionally, and given the characteristics of the prior art described above as well as others—such prior art methods generally employ tuning circuits including tunable components that provide necessary matching of impedance and load capacitance.

As we shall show and describe, compact RF driver circuits for a Paul trap used in trapped ion quantum computers constructed according to certain aspects of the present disclosure advantageously overcome these—and other—shortcomings in the art. More specifically, an illustrative compact RF driver circuit for a quantum computer Paul trap according to aspects of the present disclosure do not employ helical resonators, do not employ impedance matching and do not employ tuning circuits.

In accordance with aspects of the present disclosure, a compact RF driver for a quantum computer Paul trap includes a LC tank circuit driven with a very low output impedance amplifier exhibiting a large current-driving capability. By employing such driver circuitry—advantageously—the maximum voltage obtainable is ultimately determined by Ohmic losses in the tank circuit, including the output impedance of the amplifier.

Those skilled in the art will know and appreciate that a tank circuit, also called an LC circuit or resonant circuit or tuned circuit, is an electric circuit including an inductor (L), and a capacitor (C)—electrically connected.

Turning now to FIG. 1, there is shown a schematic diagram of a structure illustrative of aspects of the present disclosure. As illustratively shown in that figure, an RF driver according to aspects of the present disclosure includes an amplifier exhibiting a very low output impedance driving an LC circuit (LC resonator) and a Paul trap (not specifically shown). Advantageously, individual components chosen to construct such illustrative driver circuits may be any of a variety known in the art including superconducting inductors which may advantageously offer nearly lossless operation, operate at very high frequencies, and can carry high currents.

Of importance—and as noted above—amplifiers employed will exhibit a very low output impedance, i.e., <4 ohm—preferably 1 ohm or less.

Figure 2:
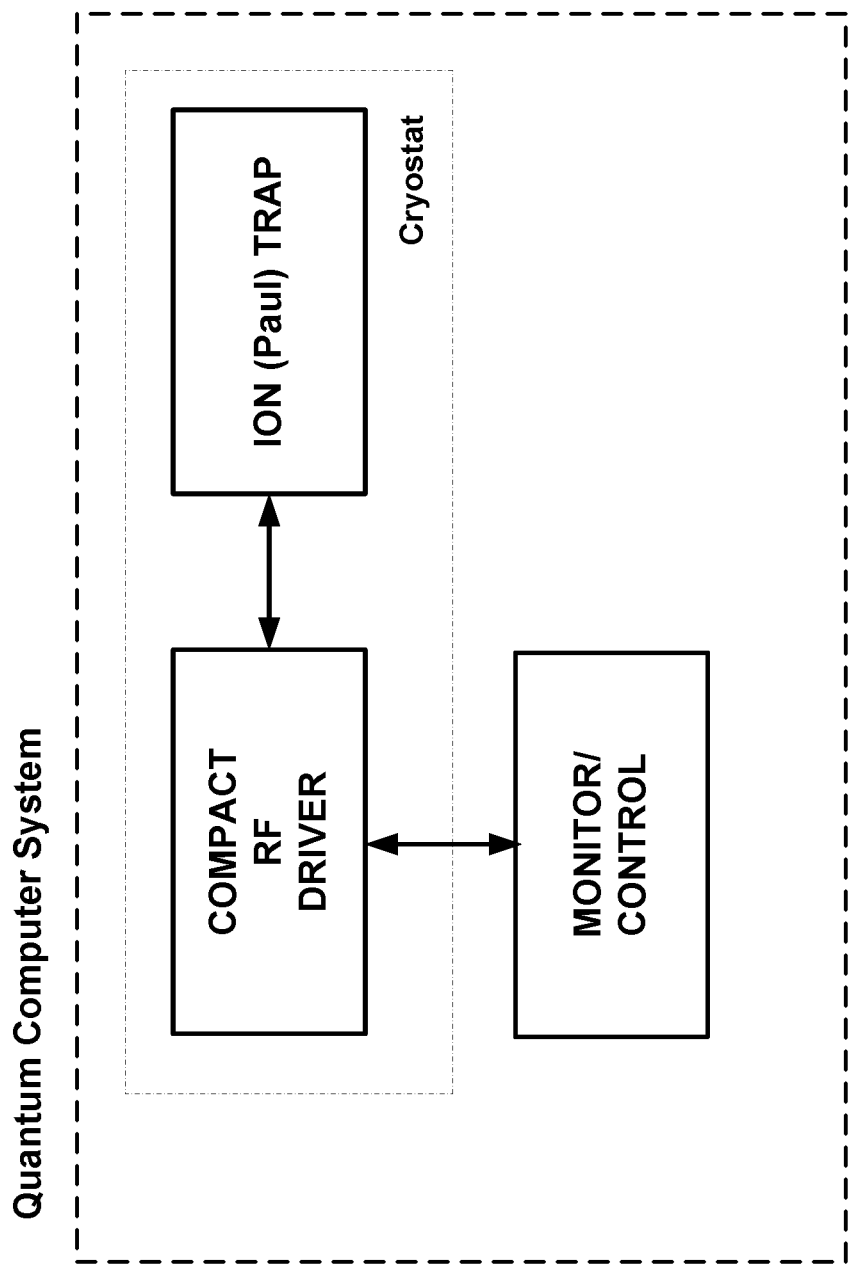
FIG. 2 is a schematic block diagram showing an illustrative, compact RF driver circuit for a Paul trap integrated into a larger illustrative quantum computing system including Paul trap, according to aspects of the present disclosure.

FIG. 2 is a schematic diagram of an illustrative tank circuit that may advantageously be employed to drive an ion trap via a low-output-impedance RF amplifier exhibiting a very low output impedance according to aspects of the present disclosure. As may be observed from that figure, the output of the low-output-impedance amplifier $V_{out}$ is electrically connected to a low-loss inductor L, the output of which is applied as trap voltage $V_{trap}$ to an ion (Paul) trap—not specifically shown. As further shown, an additional capacitance, $C_{trap}$—indicative of the capacitance of the ion trap plus any stray capacitance(s) and a series of additional capacitors ($C_1$, $C_2$) which are employed in a voltage divider used to monitor the trap voltage ($V_{mon}$)—are further characteristics of the illustrative tank circuit. Finally, we note that $R_L$ represents a load impedance of the voltage monitoring equipment.

As will be appreciated by those skilled in the art, the circuit exhibits a source impedance $R_s$ (amplifier output impedance) that will be readily understood by those skilled in the art to include any series resistance of the overall circuit.

As will be further appreciated and understood by those skilled in the art, it may be observed that an illustrative compact RF driver circuit for a Paul trap used in a trapped ion quantum computer according to aspects of the present disclosure is not necessarily tunable as are prior art circuits and structures. As noted previously, such prior art structures are generally tunable to provide for impedance and load capacitance matching—a necessary prior art characteristic eliminated according to the present disclosure.

With this illustrative circuit presented, we note that by way of illustrative example only, $R_s$—the source impedance (amplifier output impedance)—will be approximately <4 Ω (as low as 1 ohm or below preferred); L—the low-loss inductor—will exhibit a value between 0.5-2 µH, depending upon the application; $C_{trap}$—the capacitance of the ion trap plus any other stray capacitance—will exhibit a value of 10-20 pF; $C_1$—the capacitance of the first capacitor used in the voltage divider—will exhibit a value between ~1-5 pF; $C_2$—the capacitance of the second capacitor used in the voltage divider circuit—will exhibit a value between ~100 pF-1 µF; and finally, $R_L$—the load impedance of any voltage monitoring equipment used—will exhibit a value of ~1 MΩ for an oscilloscope.

To further understand this circuit and aspects of the present disclosure, we begin by analyzing any impact of the monitoring circuit. With continued reference to FIG. 1, note that any impedance due to $C_2$ may be represented as $$\sim \frac{1}{j\omega C_2}$$

which in an illustrative embodiment may be 5.3 Ω.

At $\omega = 2\pi\, 30$ MHz, $$\frac{1}{j\omega C_2} \ll R_L.$$

Accordingly, we may ignore any contribution of $R_L$.

Since $C_1$ and $C_2$ are electrically connected in series, $$C_{TOT} = \frac{1}{\frac{1}{C_1} + \frac{1}{C_2}} \approx C_1,$$

which, in an illustrative configuration is ≈5 pF. At this point we understand that $C_{TOT} + C_{Trap} = C_T$, the total parallel capacitance.

Now, we can determine the voltage applied to the trap as:

$$V_{trap} = \frac{\frac{1}{j\omega C_T}}{j\omega L + R_S + \frac{1}{j\omega C_T}} V_{amp}$$

$$= \frac{1}{1 - \omega^2 L C_T + j\omega R_S C_T} V_{amp}$$

Letting $$\omega_0^2 = \frac{1}{LC_T},\ Q = \frac{\omega_0 L}{R_S} = \frac{\omega_0}{R_S} \cdot \frac{1}{\omega_0^2} = \frac{1}{\omega_0 R_S C_T}$$

$$V_{trap} = \frac{1}{1 - \frac{\omega^2}{\omega_0^2} + j\frac{\omega}{\omega_0 Q}} V_{amp};$$

On resonance, $\omega = \omega_0$, therefore $V_{trap} = -jQV_{amp}$.

Finally, we can now determine the driving current as:

$$i_{out} = \frac{V_{amp}}{j\omega L + R_S + \frac{1}{j\omega C_T}}$$

$$= \frac{j\omega C_T V_{amp}}{1 - \frac{\omega^2}{\omega_0^2} + j\frac{\omega}{\omega_0 Q}}$$

On resonance, $i_{out} = \omega_0 C_T V_{amp}$, and therefore the effective load impedance may be represented by the following relationship:

$$R_{Load} \approx \frac{1}{\omega_0 C_T Q} = R_S$$

The effective power dissipation occurs at the location of $R_S$ as $i_{out}^2 \cdot R_S$.

Note that most of the power is dissipated at the amplifier output, only some dissipates in the inductor and other resistors in the chain. Typically, the amount is <<10% given the series resistance.

With these relationships outlined, we can now evaluate our illustrative driver circuits in operation with illustrative numerical examples.

With L=1 µH, G=20 pF; $w_0 = 2.23 \times 10^8 = 2\pi \times 35.6$ MHz.

$$Q = \frac{w_0 L}{R_S} = 56$$

and $$V_{trap} = -j \cdot 56 \times V_{amp}.$$

To produce 200V, $V_{amp}$ must substantially be 3.6V, i.e., $$i_{out} = \frac{V_{amp}}{R_S} = \frac{3.6\text{ V}}{4\Omega} = 0.9\text{ A}.$$

In consideration of power dissipation namely, $i_{out}^2 \cdot R_S = 3.2$ W; we note that about 160 mW is dissipated in the inductor (L) and electrical interconnects if about 5% of the total energy is lost in the series resistance instead of the amplifier output impedance.

Accordingly, at this point we note that if we increase Q and reduce $C_T$ we may keep a higher value of $w_0$. For example, if we reduce $C_T$ to 15 pF, and increase the inductance such that L=1.33 µH, at a same resonance frequency $w_0$, $$Q = \frac{w_0 L}{R_S} = \sqrt{\frac{L}{R_S C_T}} = 74.5$$

$$V_{trap} = -j \cdot 74.5 \times V_{amp}.$$

To achieve 200V, we need $V_{amp} = 2.68$V such that:

$$i_{out} = \frac{V_{amp}}{R_S} = 0.67\text{ A}$$

wherein power dissipation $i_{out}^2 R_S = 1.8$ W, and 5% of that (90 mW) is dissipated by the low temperatures at which the circuits are operated.

Figure 3:
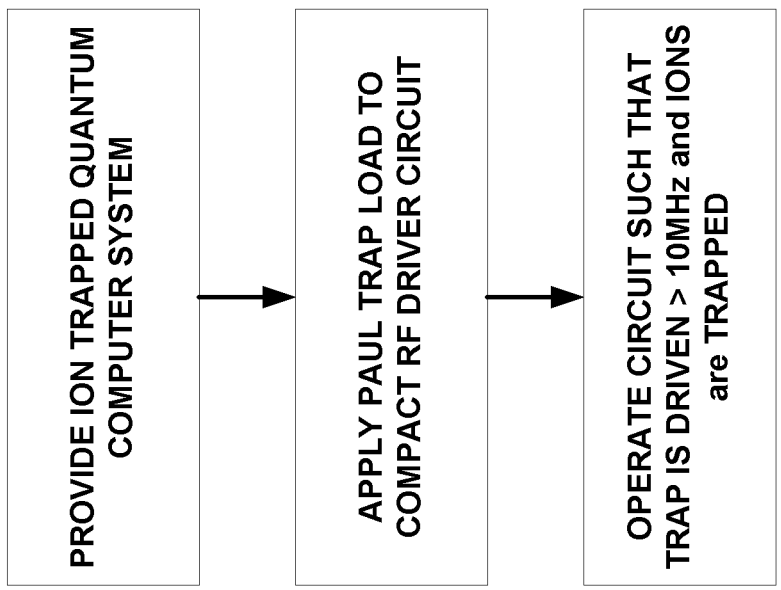
FIG. 3 is a simplified flow diagram illustrating the operation of a compact RF driver circuit for a Paul trap integrated into a larger illustrative quantum computing system including Paul trap, according to aspects of the present disclosure.

As noted previously, a compact driver circuit according to the present disclosure may advantageously be employed in contemporary applications such as quantum computing. FIG. 3 is a schematic block diagram illustrating simply a relationship between a driver circuit according to aspects of the present disclosure, and an ion (Paul) trap as part of a larger, quantum computing system.

We note that in many ion trapping applications including quantum computing, it is beneficial to operate the trap at cryogenic temperatures, mainly to reduce the negative environmental impacts, such as collision with background molecules (better vacuum), or to reduce the impact of voltage noise from the trap electrodes. In a cryogenic environment, one has the option of constructing the inductor and wiring connections to the ion trap using superconducting materials that feature reduced series resistance and no power dissipation at the inductor.

Of course, those skilled in the art will recognize that cryogenic as used herein generally means at very low temperatures, (i.e., below 100 degrees Kelvin, often below 10 degrees Kelvin).

Operationally, and with reference to FIG. 3, it may be understood by those skilled in the art that in a trapped ion quantum computer the Paul trap is applied as a load to the compact RF driver circuit such as is shown and described herein. The driver circuit is then operated such that the Paul trap is operational to trap any sample ions. As previously discussed, the trap is generally operated at frequencies above 10 MHz—preferably in the 30-50 MHz range.

At this point, while we have presented this disclosure using some specific examples, those skilled in the art will recognize that our teachings are not so limited. Accordingly, this disclosure should be only limited by the scope of the claims attached hereto.

The invention claimed is:

1. A compact RF driver circuit for a Paul trap in a trapped ion quantum computer system comprising:
   the trapped ion quantum computer system including
      the compact RF driver circuit having
      an inductive-capacitive tank circuit;
      an unmatched, low-output-impedance amplifier (<4 Ω) that electrically drives the tank circuit; and
      the Paul trap electrically connected to an output of the tank circuit.

2. The driver circuit for the quantum computer Paul trap of claim 1 wherein the amplifier exhibits an output impedance of 1 ohm or less.

3. The driver circuit for the quantum computer Paul trap of claim 1 wherein the circuit is operated under cryogenic conditions.

4. The driver circuit for the quantum computer Paul trap of claim 3 wherein the tank circuit includes a superconducting inductor and the Paul trap is driven at a trap frequency >10 MHz.

5. The driver circuit for the quantum computer Paul trap of claim 1 configured such that it does not include a tuning circuit.

6. The driver circuit for the quantum computer Paul trap of claim 1 configured such that it does not include a helical resonator.

7. A method of operating a Paul trap in a trapped ion quantum computer, said method comprising:
   providing a quantum computer system including:
      a compact RF driver circuit having
         an inductive-capacitive tank circuit;
         an unmatched, low-output-impedance amplifier (<4 ohm) electrically connected to the tank circuit;
   providing a load to the driver circuit, said load comprising the Paul trap; and
   operating the driver circuit such that the Paul trap is operational to trap sample ions.

8. The method of claim 7 wherein the unmatched, low-output-impedance amplifier exhibits an output impedance of 1 ohm or less.

9. The method of claim 7 further comprising providing cryogenic conditions for the Paul trap and the driver circuit.

10. The method of claim 7 wherein the tank circuit includes a superconducting inductor.

11. The method of claim 10 wherein the Paul trap is driven at a frequency >10 MHz.

12. The method of claim 10 wherein the Paul trap is driven at a frequency from 30 MHz to 500 MHz.

13. The method of claim 7 wherein the quantum computer system does not include a helical resonator.

14. The method of claim 7 wherein the driver circuit does not include a tuning circuit.

* * * * *